July 22, 1969 RYOJI TAMURA ET AL 3,457,521
AUTOMATIC FREQUENCY CONTROL CIRCUIT WITH PHASE DISCRIMINATOR
Filed Nov. 16, 1967 2 Sheets-Sheet 1

INVENTORS
Ryoji Tamura
Hideo Morita
BY
Marn & Jangarathis
ATTORNEYS

INVENTORS
Ryoji Tamura
Hideo Morita
BY
Marn & Jangarathis
ATTORNEYS

United States Patent Office 3,457,521
Patented July 22, 1969

3,457,521
AUTOMATIC FREQUENCY CONTROL CIRCUIT WITH PHASE DISCRIMINATOR

Ryoji Tamura and Hideo Morita, Tokyo, Japan, assignors to Nippon Electric Company Limited, Tokyo, Japan Filed Nov. 16, 1967, Ser. No. 683,603
Claims priority, application Japan, Nov. 17, 1966, 41/75,241
Int. Cl. H03b *3/04*
U.S. Cl. 331—9 9 Claims

ABSTRACT OF THE DISCLOSURE

An automatic frequency controlling device is provided in accordance with the teachings of the present invention for widening and controlling the frequency range of a high frequency alternating current wave produced by oscillator means being controlled by said device. According to an embodiment of the instant invention, a portion of the oscillator output wave is applied to branching circuit means whereat said portion of the oscillator output wave is diveded into two equal wave portions which are applied to separate parallel paths having reflecting means present therein. One of said reflecting means present in one of said paths is adapted to have a higher value of loaded Q than the other of said reflecting means whereby said one of said reflecting means will reflect a maximum value of the wave portion applied thereto when the frequencies of the oscillator output wave are near the tuning frequencies of the reflecting means while the other of said reflecting means acts as an open circuit at such frequencies to thereby reflect a minimum value. Conversely, when the frequencies of the oscillator output wave are remote from the tuning frequencies of the reflecting means, said one of said reflecting means will act as a short circuit to reflect a minimum value of the divided portion incident thereon while the other of said reflecting means present in the other of said paths now reflects a maximum value of the divided portion of the oscillator output wave incident thereon. Thereafter, the reflected waves are each applied to two detecting circuits whose outputs may be differentially compared and utilized to control the frequencies of the oscillator output wave over a widened controllable range while the gain of the control loop is increased.

This invention relates to an oscillator providing a high frequency alternating current wave extending over a preselected frequency range, and more specifically, to such oscillator embodying an automatic frequency control including a frequency discriminator for controlling a widened frequency range.

The prior art is aware of automatic frequency controls utilizing frequency discriminators to adjust the frequency of an output alternating current wave provided by an oscillator. It has been found in the prior art that the controllable frequency range of the automatic frequency controls becomes narrower and, in the case of a wide oscillating frequency deviation, that the automatic frequency control performs inaccurately when the frequency-voltage characteristic of the frequency discriminator circuit is made to be steep in order to increase automatically the frequency controlling loop gain and to lower the oscillating frequency deviation. To prevent this inconvenience, the automatic frequency controlling system, disclosed in Japanese patent specification No. 158,193, utilizes a plurality of frequency discriminator circuits having different frequency-voltage characteristics which permit, by means of synthesis of the latter characteristics, an increase in the automatic frequency controlling loop gain and a wider controllable frequency range of the automatic frequency controlling loop. In the case of the latter wider controllable frequency range, the automatic frequency controlling device becomes unavoidably complicated.

The present invention contemplates a facile automatic frequency control for increasing the gain of the automatic frequency control loop and at the same time for widening a controllable frequency range in the operation of an oscillator providing a high frequency alternating current wave variable in frequency.

A principal object of the invention is to improve the operation of an automatic frequency control embodied in an oscillator providing an alternating current wave extending over a range of frequencies.

Another object is to increase the gain of an automatic frequency control.

An additional object is to widen the controllable range of frequencies in an automatic frequency control.

A further object is to simplify the attainment of a desired frequency-voltage characteristic in an automatic frequency control.

Still another object is to provide a facile device for widening the gain of an automatic frequency control while at the same time widening a controllable range of frequencies.

In accordance with the present invention an embodiment of an automatic frequency controlling device is provided wherein a portion of the output wave of the oscillator under control is adapted to be applied to a first circuit including means therein to divide such portion of the output wave into equal wave portions and for applying such equal wave portions to parallel paths respectively containing wave reflecting means therein, said reflecting means in each of said parallel paths having equal tuning frequencies but one of said reflecting means being further adapted to have a value of loaded Q which is larger than that exhibited by the other of said reflecting means; in addition said one reflecting means is adapted to manifest high wave reflectivity and said other reflecting means is adopted to act as an open circuit when the frequencies of the equal wave portions applied thereto are near said tuning frequencies while said one reflecting means acts as a short circuit and said other reflecting means exhibits maximum reflectivity when the frequencies of the equal wave portions applied thereto are remote from said tuning frequencies; the reflected wave portions are then transmitted from said dividing means to a first detector means located in said first circuit and a second detector means present in a second circuit operably connected thereto so that the phase differences between reflected wave portions may be determined at each of said detectors; and the output of each of said detectors is then applied to means for determining the difference in voltage between the outputs of said first and second detectors whereby the outputs of said last named means is applied to the oscillator under control to vary and hence control the frequencies included within the output thereof.

A feature of the invention is that the wave dividing means, the two phase detectors and the means for determining the difference in voltage constitute essentially a frequency discriminating circuit.

The invention is readily understood from the following description taken together with the accompanying drawings in which.

Figure 2:
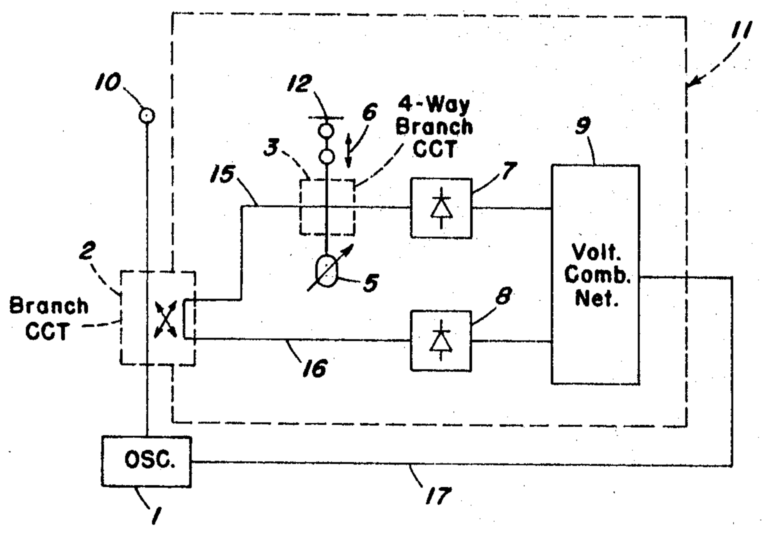
Prior Art Fig. 2.
FIG. 2 is essentially a box diagram of an automatic frequency control in the prior art.

FIG. 2 shows an automatic frequency control in the prior art and includes oscillator 1 providing an alternating current wave variable in frequency over a predetermined range and supplied via a first branching circuit 2 to output terminal 10. A first portion of the output wave taken off at the first branching circuit is transmitted on a suitable first wave transmission circuit 15 to one path (first path) of a four-way second branching circuit 3 which divides the first wave portion into equal second and third wave portions. The four-way branching circuit feeds the second wave portion via a second path directly to first reference resonator 5 and the third wave portion through a third path and line stretcher or spacer 6 to a short-circuited terminator 12. A fourth path of the four-way branching circuit is connected on line 15 to the input of first wave detector 7. The first branching circuit 2 is also connected via a second wave transmission circuit 16 to the input of second wave detector 8. The outputs of both latter detectors are connected to the input of network 9 including components and providing a function that is subsequently explained. The output of network 9 is connected via transmission line 17 back to the oscillator. The circuit just described is considered to be a frequency discriminating circuit or an automatic frequency control 11 operating in a manner which is presently explained.

It is now assumed that the oscillator is functioning to provide the second and third portions of its output wave to the second and third paths, respectively, of the four-way branching circuit. Resonator 5 reflects the second wave portion while the short-circuit terminator reflects the third wave portion. One part of the reflected second and third wave portions is supplied via the fourth path of the four-way branching circuit and line 15 to phase detector 7 and another part of the reflected second and third wave portions is returned through the first path of the latter circuit, line 15, first branching circuit 2 and line 16 to second phase detector 8, according to the phases of the reflected second and third wave portions at at the four-way branching circuit. The phase of the reflected second wave portion changes near the tuning frequency of the resonator, and the phase change is more abrupt with a higher loaded Q for the latter resonator. For the purpose of this explanation, the term loaded Q means an overall Q composed of unloaded Q (Q of a so-called resonance circuit of a simple substance) and external Q representing losses produced in the external circuit.

Figure 4:
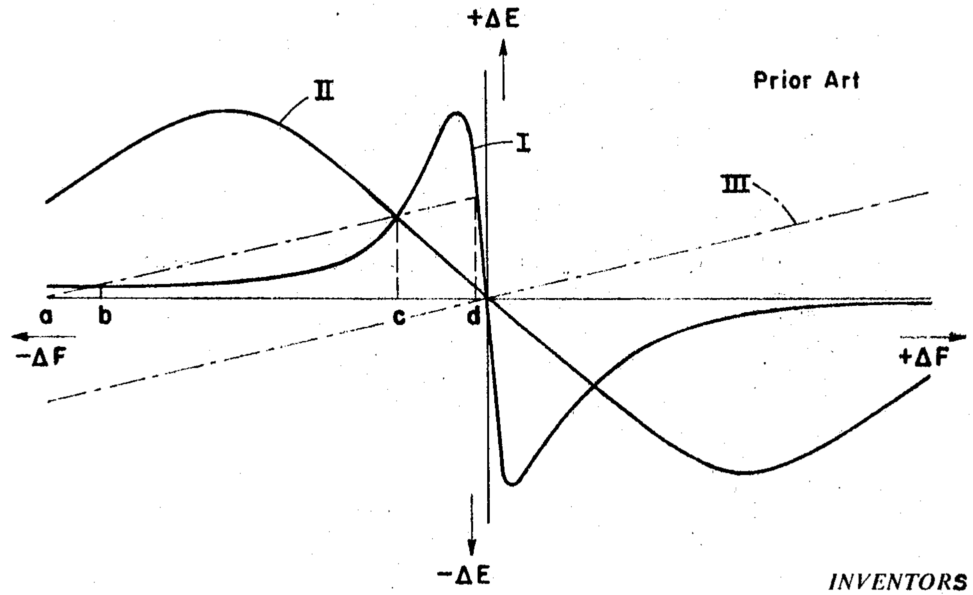
FIG. 4 is a family of curves in the prior art illustrating action obtainable in FIG. 2.

As the values of the voltages of the reflected second and third wave portions change with the frequency of the output wave provided by the oscillator, the difference between the voltages detected by phase detectors 7 and 8, circuit 11 constitutes essentially a frequency discriminating circuit. The outputs of the two detectors are supplied to voltage combining network 9 which includes a circuit for taking the difference between the two output voltages of detectors 7 and 8 to derive a third voltage, a low-pass filter and amplifier, not shown. This voltage representing the difference between the two detected output voltages is supplied via line 17 to activate the oscillator to vary the frequencies of the output wave therefrom. A frequency-voltage characteristic of the automatic frequency control 11 in FIG. 2 is illustrated in FIG. 4 in which the ordinate shows voltage and the abscissa shows frequency. In curve I, the loaded Q of resonator 5 and the automatic frequency control loop are higher than those in curve II. Curve III shows the frequency variation of the oscillator, due to the controlling of the frequency of the oscillator, is a frequency *a* which becomes a frequency *b*. This frequency variation does not attain frequency *d* even after automatic frequency control by frequency discriminating circuit 11 shown by curve I. If the frequency control were carried out in the frequency discriminating circuit shown by curve II, it is possible to stabilize frequency of the output wave in FIG. 2 up to frequency *c* in FIG. 4. As for the automatic frequency control characteristic shown in FIG. 4 and attained in a conventional automatic frequency control as illustrated in FIG. 2, a direction towards the increase of the automatic frequency control loop gain is thus opposite to a direction toward the widening of the controllable range effected by the automatic frequency controlling loop.

The frequency discriminating circuit or automatic frequency control in FIG. 2 and the frequency-voltage characteristic in FIG. 4 are disclosed, for example, in "Radiation Laboratory Series No. 11, Technique of Microwave Measurement," McGraw-Hill Company.

Figure 1:
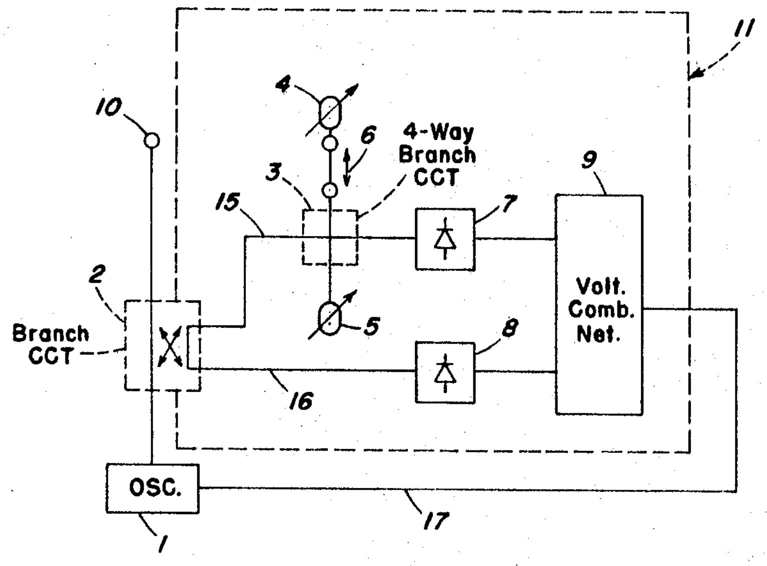
FIG. 1 is essentially a box diagram of a specific embodiment of the invention.

In accordance with a specific embodiment of the invention, as shown in FIG. 1, a reference resonator 4 is substituted for the short-circuited terminator 12 in FIG. 2, otherwise the circuits of FIGS. 1 and 2 are the same. Resonators 4 and 5 in FIG. 1 are tuned to the same frequencies which are related to the frequency range of the output wave provided by the oscillator. It is assumed that the loaded Q in resonator 5 is higher than the loaded Q in resonator 4. At frequencies of the oscillator output wave near to the tuning frequencies of both resonators 4 and 5, resonator 5 exerts more influence than resonator 4 on the effectiveness of the frequency discriminator or atuomatic frequency control 11, i.e., upon the frequency-voltage characteristic, and phase relationships because resonator 4 is at this time equivalent to an open circuit. At frequencies of the oscillator output wave distant (not near) to the tuning frequencies of both resonators 4 and 5, resonator 4 exerts more influence than resonator 5 on the effectiveness of the frequency discriminator or automatic frequency control 11, i.e., upon the frequency-voltage characteristic, and phase relationships because resonator 5 is at this time equivalent to a short-circuit. The frequency-voltage characteristics related to the automatic frequency control in FIG. 1 are illustrated in FIG. 3 in which the ordinate represent voltage while the abscissa represent frequency.

It is understood that the circuit of FIG. 1 operates essentially in the manner hereinbefore explained for FIG. 2. Briefly, in repetition, a portion of the oscillator output wave in FIG. 1 taken off in branching circuit 2 is transmitted on line 15 to a first path of four-way branching circuit 3 which divides the one wave portion into equal second and third wave portions fed into second and third paths, respectively, of the latter circuit. The second and third wave portions reflected by resonators 5 and 4 in the second and third paths, respectively, of the four-way branching circuit are applied to the respective phase detectors 7 and 8. The two output voltages of the two detectors are combined in a difference relationship in combining networks to provide a third voltage representing the difference between the latter two voltages for activating the oscillator to vary the frequency of the output wave therefrom. The solid-line curve IV is a frequency voltage characteristic of the frequency discriminating circuit or automatic frequency control 11 in FIG. 1, for example.

Figure 3:
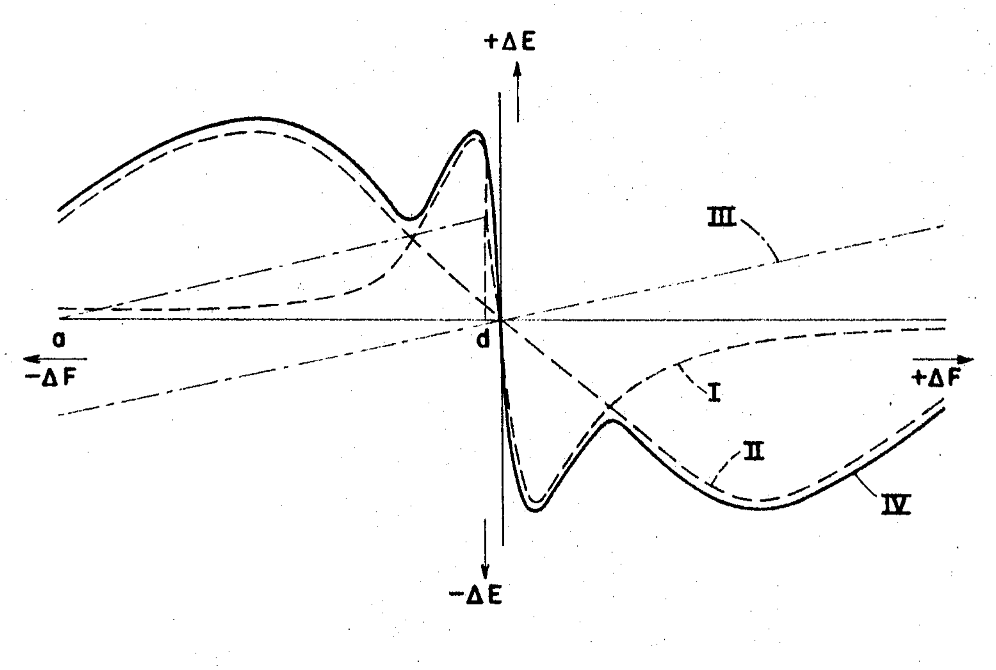
FIG. 3 is a family of curves illustrating action obtainable in FIG. 1.

The dotted line curves I and II in FIG. 3 are the frequency-voltage characteristics of the frequency discriminating circuit 11 when loaded Q of resonator 5 in FIG. 2 according to the conventional automatic frequency control shown in the latter figure is equal to the loaded Q of resonators 4 and 5 in FIG. 1. Curve III in FIG. 3 shows the frequency variation in the output wave of the oscillator due to the third voltage derived in the output of voltage combining network 9 in FIG. 1. It is seen in FIG. 3 that it is possible to control the frequency range of the oscillator output wave from *a* to *d* in accordance with the specific embodiment of the invention illustrated in FIG. 1. Thus, it is seen that while the automatic frequency control in the prior art in FIG. 2 shows it is possible to provide a controllable frequency range from *a* to *c* in FIG. 4, the automatic frequency control according to the present invention as illustrated in FIG. 1 shows it is possible to widen the controllable frequency from $c$ to $d$ and thereby to provide a controllable frequency range from $a$ to $d$ as delineated in FIGS. 3 and 4.

While the frequency-voltage characteristic in FIG. 3 of the oscillator is provided by the automatic frequency control 11 in FIG. 1 and is an example of the so-called electronic or static type, it is also possible to realize a similar characteristic for an automatic frequency control of the electro-mechanical or astatic type by using the frequency-change third voltage derived in the output of the voltage combining network 9 in FIG. 1 to drive an electric motor for varying the effective capcitance or inductance in the oscillating circuit of a generator of an alternating current wave of variable frequency.

It is understood that the automatic frequency control of the present invention as exemplified in FIGS. 1 and 3 is usable for automatically controlling the frequency of an alternating current wave in any frequency range. Obviously, the choice of circuit components depends upon the desired controllable frequency range. It is clear that when the desired controllable range of frequencies lies in the ultra-high or microwave frequency range, suitable waveguide components are utilized in FIG. 1 as the oscillator, directional couplers, hybrid junctions, detectors, adders, transmision lines, and the like.

It is also understod that the invention herein is described in specific respects for the purpose of this description. It is additionally understood that such respects are merely illustrative of the application of the invention. Numerous other arrangements may be devised by those skilled in the art without departing from the spirit and scope of the invention.

What is claimed is:

1. An automatic frequency control for widening the controllable range of the frequency of an output alternating current wave of variable frequency provided by an oscillator, comprising means connected to an output of said oscillator to take off a first portion of said output wave for transmission in a first wave transmission circuit;

means connected in said first circuit for dividing said first wave portion into equal second and third portions for transmission in first and second paths, respectively;

means connected in said first path to reflect said second wave portion;

means connected in said second path to reflect said third wave portion, said wave reflecting means in said first and second paths having equal tuning frequencies related to said output wave frequency range, said reflecting means in said first path having a loaded Q different from a loaded Q of said reflecting means in said second path;

said wave reflecting means in said first path providing maximum value of the reflected second wave portion and said wave reflecting means in said second path providing minimum value of the reffected third wave portion when the frequencies of said first wave portion are near the tuned frequencies of said first and second path wave reflecting means, said wave reflecting means in said first path providing minimum value of the reflected second wave portion and said wave reflecting means in said second path providing maximum value of the reflected third wave portion when the frequencies of said first wave portion are distant from the tuned frequencies of said first and second path wave reflecting means;

one part of said reflected second and third wave portions transmitted from said dividing means into said first circuit in a direction away from said take-off means and another part of said reflected second and third wave portions transmitted from said dividing means into said first circuit in a direction toward said take-off means and through said last-mentioned means into a second wave transmission circuit;

means connected in said first circuit in the direction away from said take-off means for detecting the phase difference between the reflected second and third wave portions in said one part thereof transmitted in said last-mentioned circuit to provide a first voltage;

means connected in said second circuit for detecting the phase difference between the reflected second and third wave portions in said another part thereof transmitted in said last-mentioned circuit to provide a second voltage;

and means connected to said first and second circuits for utilizing said first and second voltages to derive a third voltage to control the frequencies of said output wave.

2. The automatic frequency control according to claim 1 in which said wave reflecting means in said first path has a value of loaded Q which is higher than that of a loaded Q of said wave reflecting means in said second path.

3. The automatic frequency control according to claim 1 in which said wave reflecting means in said first path comprises a resonator.

4. The automatic frequency control according to claim 1 in which said wave reflecting means in said second path comprises a line stretcher and resonator connected in series.

5. The automatic frequency control according to claim 1 in which said wave reflecting means in said second path is effectively an open-circuit to provide said minimum value of said reflected third wave portion.

6. The automatic frequency control according to claim 1 in which said wave reflecting means in said first path is effectively a short-circuit to provide said minimum value of said reflected second wave portion.

7. The automatic frequency control according to claim 1 in which said wave reflecting means in said second path is effectively an open-circuit to provide said minimum value of said reflected third wave portion, and said reflecting means in said first path is effectively a short-circuit to provide said minimum value of said reflected second wave portion.

8. The automatic frequency control according to claim 1 in which said wave reflecting means in said first path comprises a resonator, and said wave reflecting means in said second path comprises a serially connected line stretcher and resonator, said first path resonator having a loaded Q which is higher in value than the value of a loaded Q of said second path resonator, said second path resonator constituting effectively an open-circuit to provide said minimum value of said reflected third wave portion, and said first path resonator constituting effectively a short-circuit to provide said minimum value of said reflected second wave portion.

9. In combination with an oscillator providing an output alternating current wave variable in frequency, means for automatically controlling the frequency of said wave over a widened and controllable range, comprising means connected to an output of said oscillator to take off a portion of said output wave for transmission in a first wave transmission circuit, means connected in said first circuit for dividing said first wave portion into equal second and third portions for transmission in first and second paths, respectively, means connected in said first path to reflect said second wave portion, means connected in said second path to reflect said third wave portion, said reflecting means in said first and second paths having equal tuning frequencies related to said output frequency range, said wave reflecting means in said first path having a value of loaded Q larger than a value of the loaded Q of said wave reflecting means in said second path, said wave reflecting means in said first path providing maximum value of the reflected second wave portion and said wave reflecting means in said second path constituting effectively an open-circuit to provide minimum value of the reflected third wave portion when the frequencies of said first wave portion are near the tuned frequencies of said first and second path wave reflecting means, and said wave reflecting means in said first path constituting effectively a short-circuit to provide minimum value of the reflected second wave portion and said wave reflecting means in said second path providing maximum value of the reflected third wave portion when the frequencies of said first wave portion are distant from the tuned frequencies of said first and second path wave reflecting means, one part of said reflected second and third wave portions transmitted from said dividing means into said first circuit in a direction away from said take-off means and another part of said reflected second and third wave portions transmitted from said dividing means into said first circuit in a direction toward said take-off means and through said last-mentioned means into a second wave transmission circuit, means connected in said first circuit in the direction away from said take-off means for detecting the phase difference between the reflected second and third wave portions in said one part thereof transmitted in said last-mentioned circuit to provide a first voltage, means connected in said second circuit for detecting the phase difference between the reflected second and third wave portions in said another part thereof transmitted in said last-mentioned circuit to provide a second voltage, and means connected to said first and second circuits for utilizing said first and second voltages to derive a third voltage representing the difference in magnitude between said last-mentioned first and second voltages to activate said oscillator to vary the frequency of said output wave over a widened and controllable range.

References Cited

UNITED STATES PATENTS 2,677,051 4/1954 Smith ---------------- 331—9 X

ROY LAKE, Primary Examiner

SIEGFRIED H. GRIMM, Assistant Examiner

U.S. Cl. X.R.

331—33; 332—137